United States Patent
Hur

(10) Patent No.: US 7,724,052 B2
(45) Date of Patent: *May 25, 2010

(54) DELAY LOCKED LOOP CIRCUIT

(75) Inventor: Hwang Hur, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/255,065

(22) Filed: Oct. 21, 2008

(65) Prior Publication Data

US 2009/0045858 A1    Feb. 19, 2009

Related U.S. Application Data

(63) Continuation of application No. 11/477,542, filed on Jun. 30, 2006, now Pat. No. 7,449,930.

(30) Foreign Application Priority Data

Sep. 29, 2005 (KR) .......................... 2005-0090966
Dec. 27, 2005 (KR) .......................... 2005-0130880

(51) Int. Cl.
*H03L 7/06* (2006.01)

(52) U.S. Cl. ..................................... 327/158; 327/149

(58) Field of Classification Search .................. None
See application file for complete search history.

(56) References Cited

U.S. PATENT DOCUMENTS

| 6,049,239 | A | 4/2000 | Eto et al. | |
| 6,867,627 | B1 | 3/2005 | Murtagh | |
| 6,985,401 | B2 * | 1/2006 | Jang et al. | 365/194 |
| 6,989,700 | B2 | 1/2006 | Kim | |
| 7,019,573 | B2 | 3/2006 | Matsuno | |
| 7,026,859 | B2 | 4/2006 | Yang et al. | |
| 7,046,061 | B2 * | 5/2006 | Kwak | 327/158 |
| 7,282,974 | B2 | 10/2007 | Lee | |
| 7,336,752 | B2 * | 2/2008 | Vlasenko et al. | 375/376 |
| 2004/0239389 | A1 | 12/2004 | Matsuno | |

(Continued)

FOREIGN PATENT DOCUMENTS

JP    2004-362757 A    12/2004

(Continued)

OTHER PUBLICATIONS

Search Report issued by the Taiwanese Intellectual Property Office together with an Office Action on Mar. 18, 2009.

(Continued)

*Primary Examiner*—Cassandra Cox
(74) *Attorney, Agent, or Firm*—IP & T Law Firm PLC

(57) ABSTRACT

A delay locked loop (DLL) circuit for a synchronous dynamic random access memory (SDRAM) is provided. If a locking state is broken due to an external change such as a change of tCK or power supply voltage, indicating that a delay of a delay replication modeling unit involved in a DRAM is abruptly changed, the locking state can be recovered within a certain time, e.g., 200 tCK, by creating an internal reset signal in the DLL circuit by a circuit that monitors the state and then conducting a phase update using a rough delay value.

17 Claims, 7 Drawing Sheets

U.S. PATENT DOCUMENTS

| | | |
|---|---|---|
| 2005/0110541 A1 | 5/2005 | Jeon |
| 2005/0140408 A1 | 6/2005 | Lim |
| 2005/0195004 A1 | 9/2005 | Kim |

FOREIGN PATENT DOCUMENTS

| | | |
|---|---|---|
| JP | 2005-251370 A | 9/2005 |
| KR | 2003-0016281 | 2/2003 |
| TW | 200307397 | 12/2003 |
| TW | 200518465 | 6/2005 |
| TW | 200527822 | 8/2005 |

OTHER PUBLICATIONS

Korean Office Action issued in corresponding Korean Patent Application No. KR. 10-2005-0130880, dated Nov. 16, 2006.

* cited by examiner

DELAY LOCKED LOOP CIRCUIT

RELATED APPLICATIONS

This application is a Continuation of U.S. application Ser. No. 11/477,542, filed Jun. 30, 2006, now U.S. Pat. No. 7,449,930, claiming priority of Korean Application Nos. 2005-0090966, filed Sep. 29, 2005, and 2005-0130880, filed Dec. 17, 2005, the entire contents of each of which are hereby incorporated by reference.

FIELD OF THE INVENTION

The present invention relates to semiconductor design technologies; and, more particularly, to a delay locked loop (DLL) for a synchronous dynamic random access memory (SDRAM).

DESCRIPTION OF RELATED ARTS

A synchronous semiconductor memory device such as double data rate (DDR) SDRAM performs data transmission with external devices by using an internal clock signal that is synchronized with an external clock signal from an external device such as a memory controller and then locked. This is because temporal synchronization between a detected clock signal and data is very important for stable data transmission between the memory and the memory controller. In other words, for stable data transmission, the data should be correctly arranged at the edge or center of the clocks by reverse-compensating for time when the data is carried on a bus from clocks of respective elements that transmit the data. Clock synchronization circuits used for this purpose are phase locked loop (PLL) circuits and DLL circuits. For example, if the frequency of an external clock signal is different from that of an internal clock signal, the PLL circuit fulfills a frequency multiplication function. If the frequency of the external clock signal is identical to that of the internal clock signal, the DLL circuit is usually adopted.

The DLL circuit creates an internal clock signal through compensation for clock delay components that occur during the course of conveying an output clock signal to a data output stage within a semiconductor memory device and allows the internal clock signal used for input/output of final data to be synchronized with an external clock signal. Advantages of DLL circuit are little noise generation and small-sized circuit implementation, compared to the PLL circuit. Due to such merits, the DLL circuit is generally utilized in the semiconductor memory device as a synchronization circuit. Among various DLL circuits, a register controlled DLL circuit is most widely employed. A register can store a locked delay value, which keeps the value in the register when a power is interrupted. The time needed for an initial clock locking by is reduced by loading the fixed delay value stored in the register when the power is resumed and then using the delay value for clock locking.

FIG. 1 is a block diagram for describing a configuration of a conventional DLL circuit.

Referring to FIG. 1, the conventional DLL circuit generally includes a clock buffer 10, first and second phase delay and delay controllers 20 and 30, a pre duty cycle correction (DCC) unit 40, a DCC unit 50, a delay replication modeling unit 60, a phase comparator 70, a mode generator 80, a DLL controller 90, a clock generator 100, and an output driver 110.

The clock buffer 10 receives and buffers an external clock signal, and outputs first and second internal clock signals CLKIN1 and CLKIN2 of in-phase, a reference internal clock signal REFCLK and a third internal clock signal CONTCLK.

The first phase delay and delay controller 20 delays a phase of the first internal clock signal CLKIN1 and outputs it as a first internal delay clock signal MIXOUT_R, in response to first and second locked state signals FAST_MODE_END and LOCK_STATE provided from the mode generator 80.

Similarly, the second phase delay and delay controller 30 delays a phase of the second internal clock signal CLKIN2 and provides it as a second internal delay clock signal MIXOUT_F, in response to third and fourth locked state signals FAST_MODE_ENDF and LOCK_STATEF from the mode generator 80.

The pre DCC unit 40 buffers the first internal delay clock signal MIXOUT_R and outputs it as a rising clock RISING_CLK; and also buffers and inverts the second internal delay clock signal MIXOUT_F, and outputs an inverted clock signal as a falling clock FALLING_CLK. Here, the duties of the rising clock RISING_CLK and the falling clock FALLING_CLK are in a complementary relationship. That is, if a high pulse width of the external clock is wide, a high pulse width of the rising clock RISING_CLK is wide, while a high pulse width of the falling clock FALLING_CLK is narrow.

The DCC UNIT 50 takes the rising clock RISING_CLK and the falling clock FALLING_CLK of which clock duties are complementary to each other, and corrects the duty of each clock to provide them as a rising feedback clock IFBCLKR and a falling feedback clock IFBCLKF.

The delay replication modeling unit 60 models the rising feedback clock IFBCLKR and the falling feedback clock IFBCLKF from the DCC unit 50 in delay factors that occur during the period of arriving at the phase delay section after receipt of clock from the exterior of chip and dispatching an output clock of the phase delay section to the exterior of the chip. Through such modeling, a compensated rising feedback clock FBCLKR and a compensated falling feedback clock FBCLKF, for which a time difference between the external clock and the actual internal clock is compensated, are derived. The correct delay factors are used to determine a distortion value as the performance of the DLL circuit. For the delay replication modeling unit 60, there are methods of shrinking, simplifying, and using basic circuits as they are. In fact, the delay replication modeling unit 60 models the CLOCK BUFFER, the DLL clock driver, an R/F divider, and an output buffer in advance.

The phase comparator 70 compares each of the compensated rising feedback clock FBCLKR and the compensated falling feedback clock FBCLKF from the delay replication modeling unit 60 with the reference internal clock signal REFCLK from the clock buffer 10 to obtain phase detection signals. Regularly, the external clock is divided by a divider to use a lower frequency in the comparison, so that power consumption of the DLL circuit can be reduced.

The mode generator 80 generates the first and second locked state signals FAST_MODE_END and LOCK_STATE, indicating that a delay lock of clock in the first phase delay and delay controller 20 is established, by using a first location comparison control signal FINE, a first coarse delay control signal FM_PDOUT and a first fine delay control signal COARSE from the phase comparator 70. Also, it produces the third and fourth locked state signals FAST_MODE_ENDF and LOCK_STATEF, denoting that a delay lock of the clock in the second phase delay and delay controller 30 is made, based on a second location comparison control signal FINEF, a second coarse delay control signal FM_PDOUTF and a second fine delay control signal COARSEF from the phase comparator 70.

The speed of phase update that is conducted in the DLL circuit is varied depending on output logical values of the first and fourth locked state signals provided from the mode generator 80. The phase update implies that a phase of each of the rising feedback clock FBCLKR and the falling feedback clock FBCLKF compensated by the DLL circuit is compared with that of the reference internal clock signal REFCLK, to continuously track a phase difference therebetween. Examples thereof are introduced below.

If the phase difference between each of the compensated rising feedback clock FBCLKR and falling feedback clock FBCLKF and the reference internal clock signal REFCLK is large, the first and third locked state signals FAST_MODE_END and FAST_MODE_ENDF are kept at a logic low value. Then, the first and second phase delay and delay controllers 20 and 30, which get the signals, shift the phases of the compensated rising feedback clock FBCLKR and falling feedback clock FBCLKF by a four-unit delay at a time, respectively. If the phase difference is less than the four-unit delay, the first and third locked state signals FAST_MODE_END and FAST_MODE_ENDF are maintained to be a logic high value. The first and second phase delay and delay controllers 20 and 30 shift the phases of the compensated rising feedback clock FBCLKR and falling feedback clock FBCLKF by a two-unit delay at a time, respectively. And, if the phase difference is smaller than a one-unit delay, the first and second phase delay and delay controllers 20 and 30 fine-tune the phases of the feedback signals while the second and fourth locked state signals LOCK_STATE and LOCK_STATEF rise from a logic low to a logic high. After that, if the phases become in-phase, the DCC unit 50 is enabled by a phase update locking information signal DCC_ENB generated by itself and the phase update process is completed. In this process, the compensated rising feedback clock FBCLKR and falling feedback clock FBCLKF are controlled in a different manner but in the same manner after the phase update has been locked.

The DLL controller 90 provides a reset signal RESET to control the operation of the DLL circuit in response to a DLL reset signal DLL_RESETB and a DLL inactivation signal DIS_DLL transmitted from the exterior of the memory.

The clock generator 100 receives the third internal clock signal CONTCLK from the clock buffer 10 and the phase update locking information signal DCC_ENB from the DCC unit 50 and generates a first clock PULSE2 notifying a start of a phase update period at the time of escaping a power-down mode and a second clock PULSE8_11 notifying an end thereof.

The output driver 110 buffers and outputs the rising feedback clock IFBCLKR and falling feedback clock IFBCLKF from the DCC UNIT 50.

The DLL circuit having the configuration as shown in FIG. 1 assumes a locking state with locking information through the phase update to derive the internal clock where a delay inside the DRAM is compensated. Once the locking information is generated, a small amount of the phase update process up to about 15 ps is repeatedly performed, which corrects the phase variation of the internal clock.

However, in case there is an external effect such as a change of a tCK or power supply voltage VDD, indicating that a delay of the delay replication modeling unit inside the DRAM is abruptly changed under the locking state, the locking state becomes temporarily broken. In this case, since the DLL circuit doesn't monitor whether the locking state is maintained between the feedback clock signal FBCLK and the internal clock signal REFCLK after the locking information is created and it assumes the locking state, the phase update is made with respect to only the delay of a very small amount of about 0 to about 15 ps depending on a location relationship between the feedback clock signal FBCLK and the internal clock signal REFCLK. For such reason, if the locking state is broken due to the abrupt change of the internal delay modeled in the existing DLL circuit, much time, e.g., more than 200 tCK, is taken for recovering the state because the phase update uses a small amount of the delay up to about 15 ps.

SUMMARY OF THE INVENTION

It is, therefore, an object of the present invention to provide a DLL circuit device and a method for a semiconductor memory device capable of again recovering a locking state at a rapid speed when the locking state is broken due to an external effect such as a change of a tCK or power supply voltage VDD indicating that a delay of a delay replication modeling unit is abruptly changed under the locking state.

In accordance with one aspect of the present invention, there is provided a synchronous memory device that is operated in synchronism with an external clock, including: a DLL for performing a phase update to generate a DLL clock of a locking state and conducting the phase update in a smaller delay amount than a one-unit delay under the locking state; and a control unit for resetting the DLL when the locking state is broken by an external change.

In accordance with another aspect of the present invention, there is provided a DLL circuit including: a clock buffer for buffering an external clock signal and outputting internal clock signals; a phase delay and delay control unit for receiving the internal clock signals and delaying a phase of the internal clock signals to provide delayed internal clock signals; a delay replication modeling unit for modeling the output signals of the phase delay and delay control unit in delay factors of a clock signal within a memory and providing modeled signals as feedback signals; a phase comparator for receiving and comparing the internal clock signal and each of the feedback signals and detecting a phase difference between the signals to output detection signals and control signals; a mode generator for generating phase update mode signals to control a phase delay of the phase delay and delay control unit in response to the control signals; and a DDL controller for providing a reset signal to control the operation of the DLL in response to the detection signals.

As described above, the related art DLL circuit takes significant time to regain a locking state because the phase update is performed with a very small delay amount after the locking state has once been established, although the locking state is broken due to any external change.

In the present invention, however, if the locking state is broken due to an external change such as a change of a tCK or power supply voltage VDD, the locking state can again be recovered within a certain time, e.g., 200 tCK. A reset signal is internally created in the DLL circuit by a circuit that monitors the state and then the phase update is conducted using a rough delay value. The present invention employs a scheme that creates an internal reset signal in the DLL circuit when a difference of more than a certain delay has taken place between an internal clock signal and a feedback clock signal FBCLK that passes through the delay replication modeling unit of the DRAM.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a delay locked loop (DLL) circuit in accordance with the present invention will be described in detail with reference to the accompanying drawings so that the invention can be readily carried out by those in the art to which the invention pertains.

Figure 1:
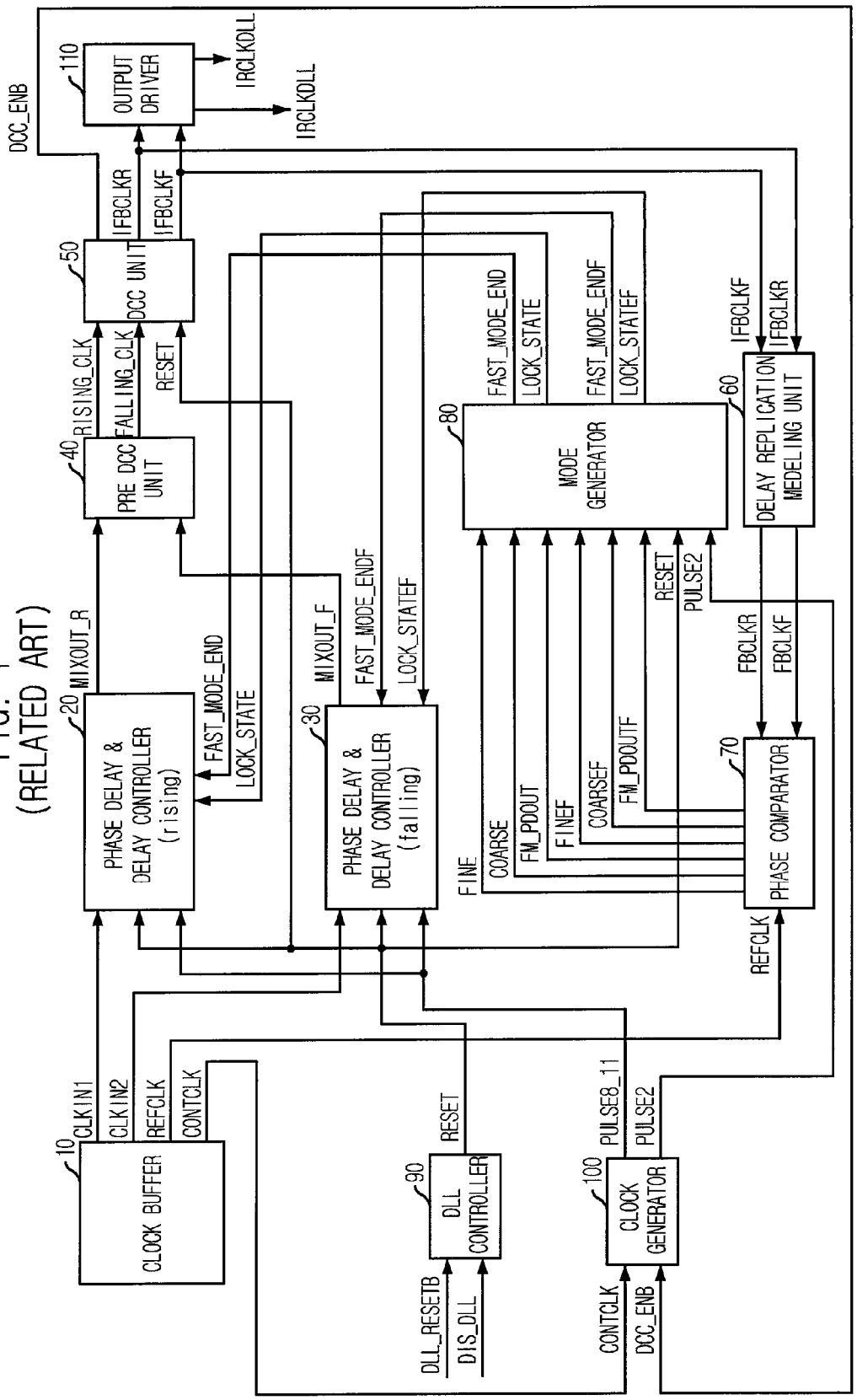
FIG. 1 is a block diagram of a conventional DLL circuit.
Figure 2:
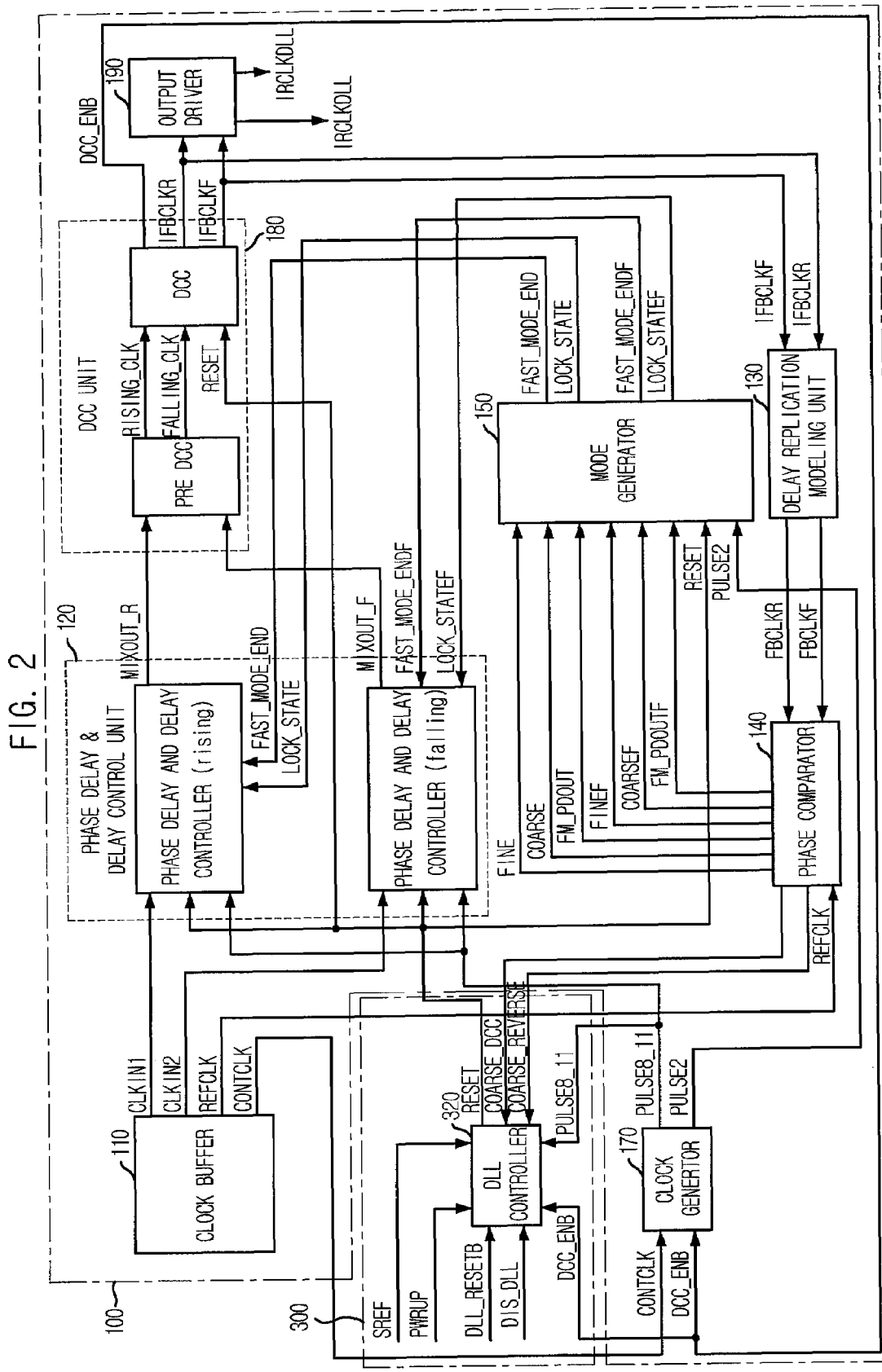
FIG. 2 is a block diagram describing a configuration of a DLL circuit in accordance with an embodiment of the present invention.

FIG. 2 is a block diagram for describing a configuration of a DLL circuit in accordance with the present invention.

Referring to FIG. 2, a synchronous memory device that is operated in synchronism with an external clock includes a DLL 100 for performing a phase update to generate a DLL clock of a locking state and conducting the phase update in a smaller delay amount than a one-unit delay under the locking state, and a control unit 300 for resetting the DLL when the locking state is broken by an external change under the locking state.

More specifically, the DLL 100 includes a clock buffer 110 for buffering an external clock signal and outputting internal clock signals, a phase delay and delay control unit 120 for accepting the internal clock signals and delaying a phase thereof to output delayed internal clock signals, a delay replication modeling unit 130 for modeling the output signals of the phase delay and delay control unit 120 in delay factors of a clock signal within the memory and providing modeled signals as feedback signals FBCLK, a phase comparator 140 for receiving the internal clock signal REFCLK and each of the feedback signals FBCLK and detecting a phase difference between the respective two signals to output detection signals, COARSE_DCC and COARSE_REVERSE, and control signals, FINE, COARSE, FM_PDOUT, FINEF, COARSEF and FM_PDOUTF, and a mode generator 150 for generating phase update mode signals, FAST_MODE_END, LOCK_STATE, FAST_MODE_ENDF and LOCK_STATEF, to control a phase delay of the phase delay and delay control unit 120 in response to the control signals.

In addition, the DLL 100 further includes a clock generator 170 for generating a first clock PULSE2 notifying a start of a phase update period and a second clock PULSE8_11 notifying an end thereof, a DCC unit 180 enabled by a locking information signal DCC_ENB when the phase update is completed and the locking information signal is activated for correcting a duty of the output clock signals of the phase delay and delay control unit to output corrected clock signals wherein the DCC unit 180 has a pre DCC block and a DCC block, and an output buffer 190 for receiving data from a memory core and outputting data to a data output pad in synchronism with output signals of the DCC unit 180.

As described above, the control unit 300 is composed of the DLL controller 320 for providing the reset signal RESET to control the operation of the DLL in response to the detection signals COARSE_DCC and COARSE_REVERSE.

Figure 3:
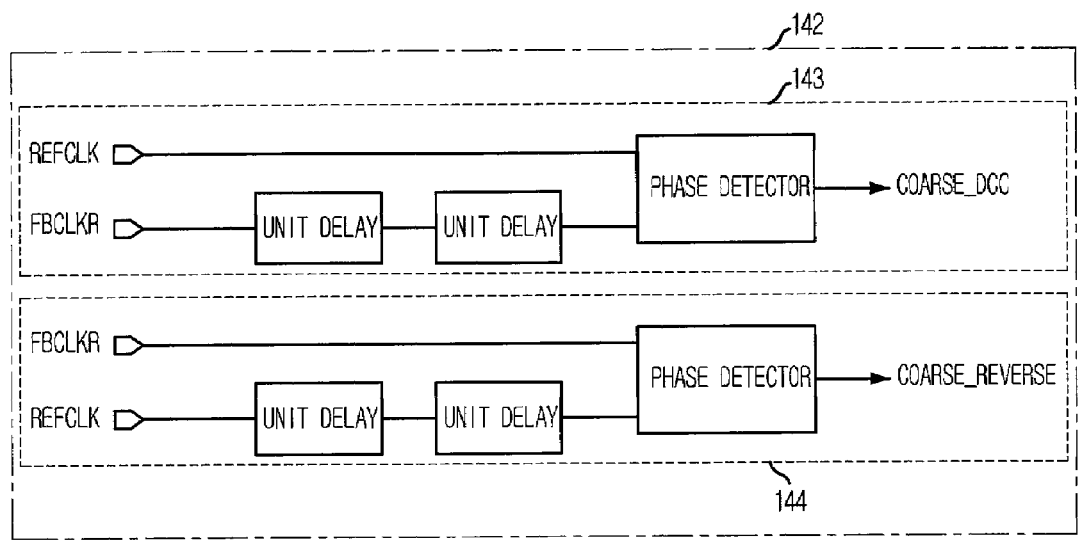
FIG. 3 is a block diagram explaining a configuration to judge a locking success/failure by a phase comparator shown in FIG. 2.

FIG. 3 is a block diagram of a configuration to judge a locking success/failure by the phase comparator 140 of the present invention.

Figure 4:
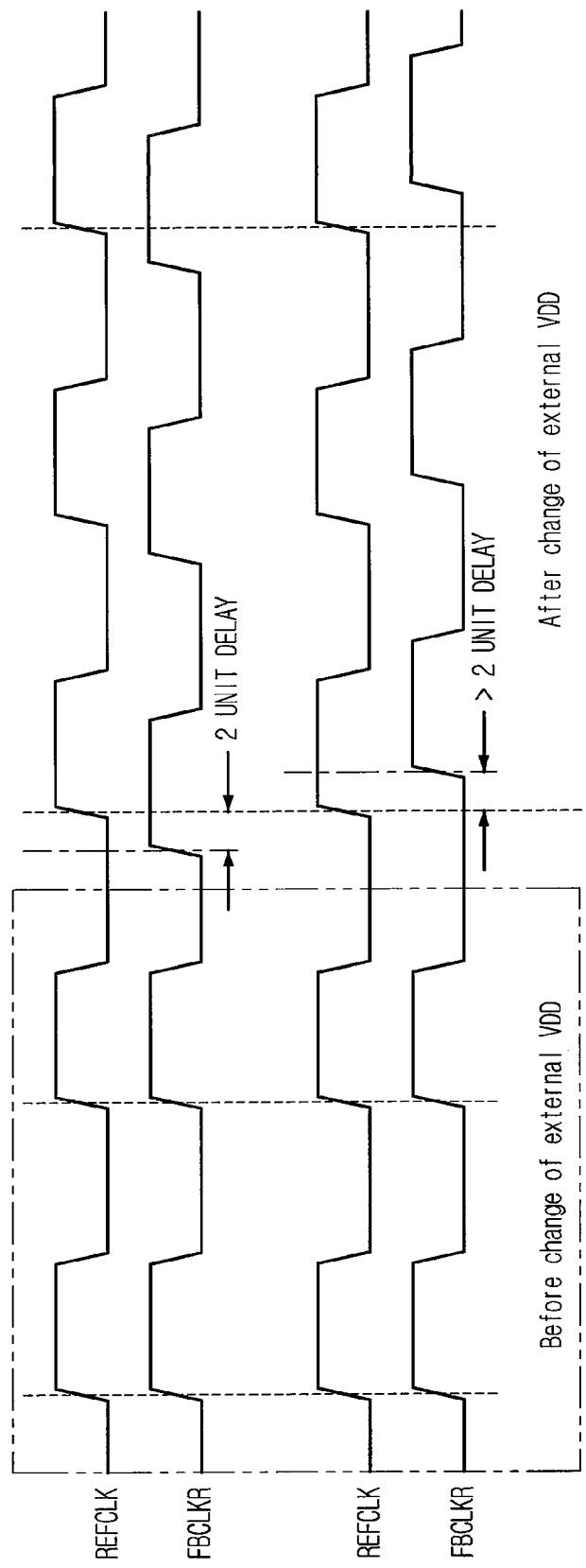
FIG. 4 is a timing diagram for explaining a configuration to judge a locking success/failure by the phase comparator.

FIG. 4 is a timing diagram for explaining operation of the phase comparator 140.

The phase comparator 140 includes a detector 142 that detects a phase difference between the internal clock signal REFCLK and each of the feedback clock signals FBCLK to monitor the phase difference therebetween that occurs due to an external factor such as an abrupt change of a tCK or power supply voltage VDD when the DLL is in a locking state, and then outputs the detection signals COARSE_DCC and COARSE_REVERSE.

The detector 142, which is provided as the phase comparator 140, includes a first detector 143 for outputting the first detection signal COARSE_DCC to judge whether a rising edge of the feedback clock signal FBCLK is within a two-unit delay on the basis of a rising edge of the internal clock signal REFCLK, and a second detector 144 for outputting the second detection signal COARSE_REVERSE to judge whether the rising edge of the internal clock signal REFCLK is within the two-unit delay on the basis of the rising edge of the feedback clock signal FBCLK. FIG. 4 exemplifies, as a timing diagram, an embodiment of the first detector 143 for outputting the first detection signal COARSE_DCC to judge whether the rising edge of the feedback clock signal FBCLK is within the two-unit delay on the basis of the rising edge of the internal clock signal REFCLK.

Explaining the control signals created by the phase comparator in more detail with respect to FIG. 2, there are generated a first control signal indicating whether the rising edge of the feedback clock signal precedes or lags on the basis of the rising edge of the internal clock signal, a second control signal denoting whether the rising edge of the feedback clock signal is within a four-unit delay on the basis of the rising edge of the internal clock signal, a third control signal denoting whether the rising edge of the feedback clock signal is within a one-unit delay on the basis of the rising edge of the internal clock signal, a fourth control signal indicating whether a falling edge of the feedback clock signal precedes or lags on the basis of a falling edge of the internal clock signal, a fifth control signal denoting whether the falling edge of the feedback clock signal is within a four-unit delay on the basis of the falling edge of the internal clock signal, and a sixth control signal denoting whether the falling edge of the feedback clock signal is within a one-unit delay on the basis of the falling edge of the internal clock signal.

Figure 5:
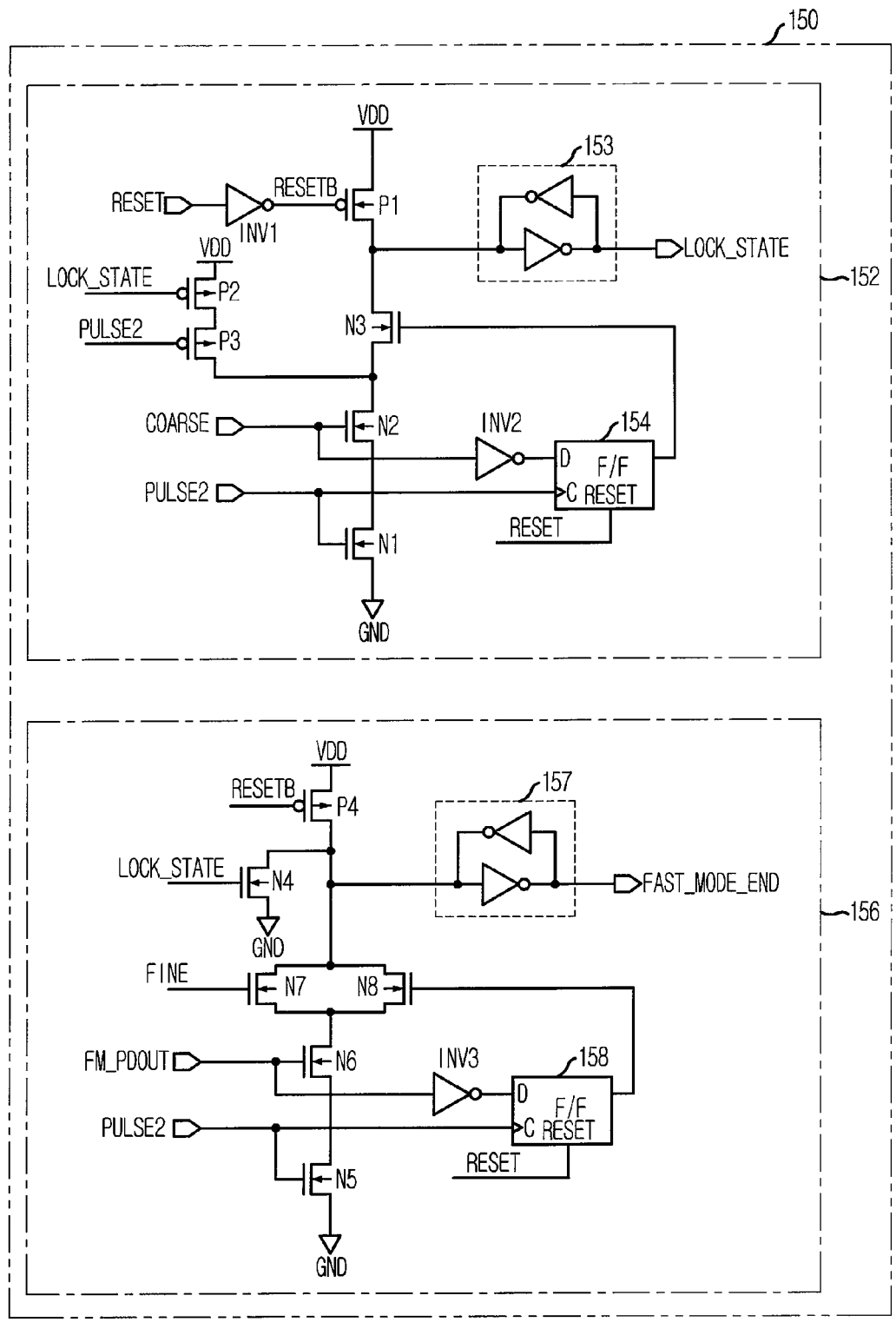
FIG. 5 is a detailed circuit diagram of a mode generator shown in FIG. 2.

FIG. 5 is a detailed circuit diagram of a common mode generator.

Referring to FIG. 5, the mode generator 150 is provided with a fast end signal output unit 156 for outputting a rising fast end signal FAST_MODE_END or a falling fast end signal FAST_MODE_ENDF activated to shift a phase of the phase delay and delay controller by the two-unit delay at a time, rather than by the four-unit delay, in response to the first and second control signals FINE and FM_PDOUT or the fourth and fifth control signals FINEF and FM_PDOUTF, and a locking signal output unit 152 for providing a rising locking signal LOCK_STATE or a falling locking signal LOCK_STATEF activated to shift a phase of the phase delay and delay controller after further dividing the one-unit delay for fine correction, rather than by the two-unit delay at a time, in response to the third control signal COARSE or the sixth control signal COARSEF.

Out of the elements of the mode generator 150, the locking signal output unit 152 includes a first inverter INV1 for inverting and outputting the reset signal RESET, a first PMOS transistor P1 for controlling a conveyance of a power supply voltage VDD in response to an output signal of the first inverter INV1, a second PMOS transistor P2 for controlling a conveyance of the power supply voltage VDD in response to the rising locking signal LOCK_STATE or the falling locking signal LOCK_STATEF, a third PMOS transistor P3 for controlling a delivery of the power supply voltage VDD in response to the first clock PULSE2, a first NMOS transistor N1 for controlling a delivery of a ground voltage GND in response to the first clock PULSE2, a second NMOS transistor N2 for controlling a conveyance of the ground voltage GND in response to the third control signal COARSE or sixth control signal COARSEF, a second inverter INV2 for inverting and outputting the third control signal COARSE or sixth control signal COARSEF, a first Flip-Flop (F/F) 154 wherein an output signal of the second inverter INV2 is received as a data input, the first clock PULSE2 as a clock input and the reset signal RESET as a reset input, a third NMOS transistor N3 for controlling a conveyance of the power supply voltage VDD from the second and third PMOS transistors P2 and P3 or of the ground voltage GND from the first and second NMOS transistors N1 and N2 in response to an output signal of the first F/F 154, and a first latch 153 for keeping a logical value of the power supply voltage VDD from the first PMOS transistor P1, or of the power supply voltage VDD from the second and third PMOS transistors P2 and P3 and the third NMOS transistor N3, or of the ground voltage GND from the first to third NMOS transistors N1 to N3, and outputting the rising locking signal LOCK_STATE or the falling locking signal LOCK_STATEF.

The fast end signal output unit 156 includes a fourth PMOS transistor P4 for controlling a conveyance of the power supply voltage VDD in response to an inverted signal RESETB of the reset signal RESET, a fourth NMOS transistor N4 for controlling a conveyance of the ground voltage GND in response to the rising locking signal LOCK_STATE or the falling locking signal LOCK_STATEF, a fifth NMOS transistor N5 for controlling a delivery of the ground voltage GND in response to the first clock PULSE2, a sixth NMOS transistor N6 for controlling a delivery of the ground voltage GND in response to the second control signal FM_PDOUT or fifth control signal FM_PDOUTF, a seventh NMOS transistor N7 for controlling a conveyance of the ground voltage GND in response to the first control signal FINE or fourth control signal FINEF, a third inverter INV3 for inverting and outputting the second control signal FM_PDOUT or fifth control signal FM_PDOUTF, a second F/F 158 wherein an output signal of the third inverter INV3 is received as a data input, the first clock PULSE2 as a clock input, and the reset signal RESET as a reset input, an eighth NMOS transistor N8 for controlling a conveyance of ground GND in response to an output signal of the second F/F 158, and a second latch 157 for keeping a logical value of the power supply voltage VDD from the fourth PMOS transistor P4, or of the ground voltage GND from the fourth NMOS transistor N4, or of the ground voltage GND from the fifth to seventh NMOS transistors N5 to N7, or of the ground voltage GND from the fifth and the sixth NMOS transistors N5 and N6 and the eighth NMOS transistor N8, and outputting the rising fast end signal FAST_MODE_END or the falling fast end signal FAST_MODE_ENDF. The locking information signal DCC_ENB is activated when the rising locking signal LOCK_STATE and the falling locking signal LOCK_STATEF are all activated.

Figure 6:
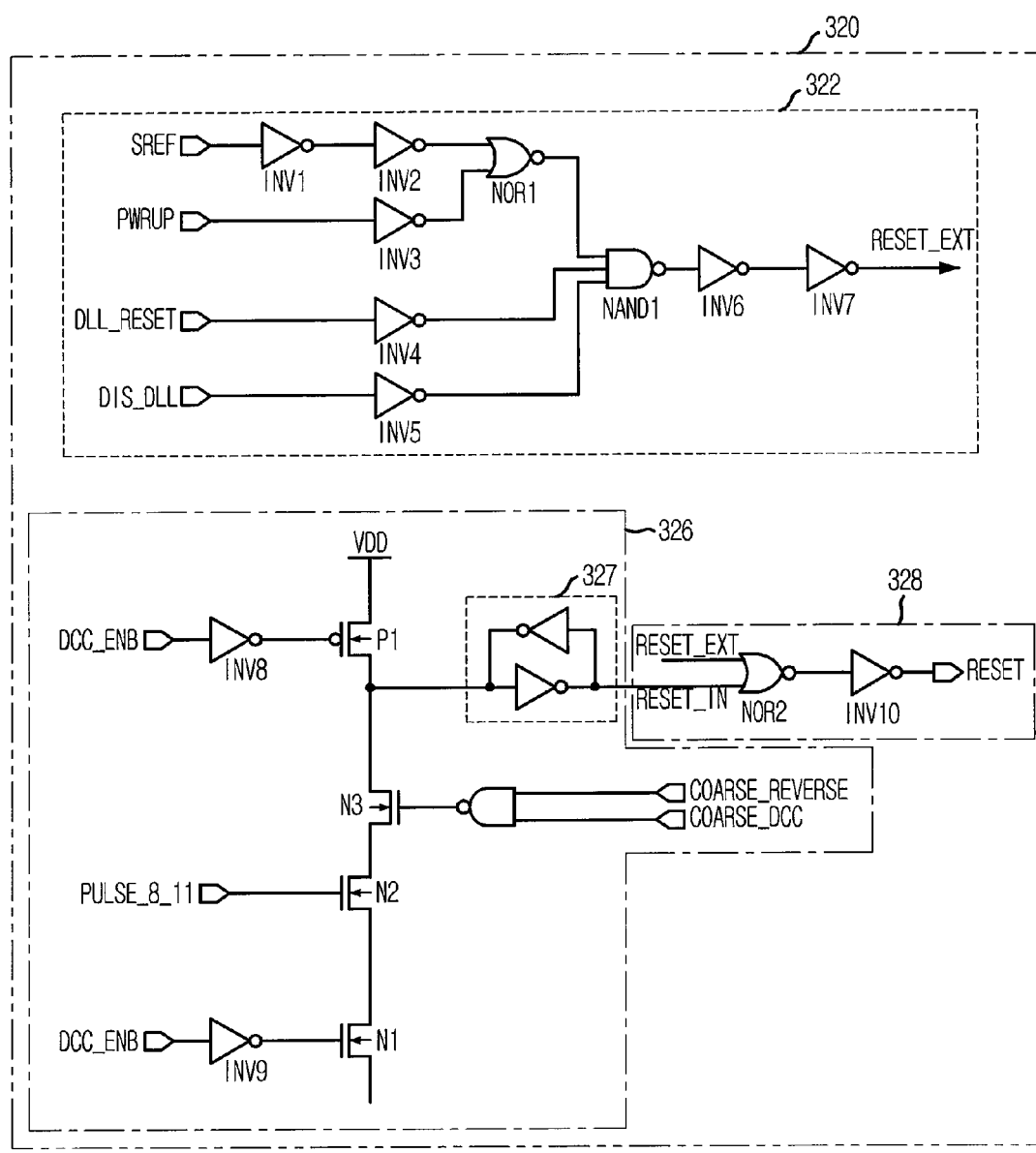
FIG. 6 is a detailed circuit diagram of the DLL controller.

FIG. 6 is a detailed circuit diagram of the DLL controller in accordance with the present invention.

Referring to FIG. 6, the DLL controller includes an external DLL controller 322 for receiving a self refresh information signal SREF, a power-up information signal PWRUP, a DLL reset signal DLL_RESET and a DLL inactivation signal DIS_DLL provided from outside, and outputting an external reset signal RESET_EXT to control the operation of the DLL, an internal DLL controller 326 for outputting an internal reset signal RESET_IN to control the operation of the DLL in response to the first and second detection signals COARSE_DCC and COARSE_REVERSE when the locking information signal DCC_ENB is activated and the second clock PULSE8_11 is toggled, and a reset signal output unit 328 for receiving the external reset signal RESET_EXT and the internal reset signal RESET_IN and providing an output signal as the reset signal RESET.

Among the elements of the DLL controller 320, the external DLL controller 322 includes a first inverter INV1 for inverting and outputting the self refresh information signal SREF, a second inverter INV2 for inverting and outputting an output signal of the first inverter INV1, a third inverter INV3 for inverting and outputting the power-up information signal PWRUP, a fourth inverter INV4 for inverting and outputting the DLL reset signal DLL_RESET, a fifth inverter INV5 for inverting and outputting the DLL inactivation signal DIS_DLL, a first NOR gate NOR1 for NOR-operating and outputting an output signal of the second inverter INV2 and an output signal of the third inverter INV3, a first NAND gate NAND1 for NAND-operating and outputting an output signal of the first NOR gate NOR1 and output signals of the fourth and fifth inverters INV4 and INV5, a sixth inverter INV6 for inverting and outputting an output signal of the first NAND gate NAND1, and a seventh inverter INV7 for inverting an output signal of the sixth inverter INV6 and outputting an output signal as the external reset signal RESET_EXT.

The internal DLL controller 326 includes an eighth inverter INV8 for inverting and outputting the locking information signal DCC_ENB, a ninth inverter INV9 for inverting and outputting the locking information signal DCC_ENB, a first PMOS transistor P1 for controlling a conveyance of the power supply voltage VDD in response to an output signal of the eight inverter INV8, a first NMOS transistor N1 for controlling a conveyance of the ground voltage GND in response to an output signal of the ninth inverter INV9, a second NMOS transistor N2 for controlling a delivery of the ground voltage GND in response to the second clock PULSE8_11, a second NAND gate NAND2 for NAND-operating and outputting the first and second detection signals COARSE_DCC and COARSE_REVERSE, a third NMOS transistor N3 for controlling a delivery of the ground voltage GND in response to an output signal of the second NAND gate NAND2, and a latch 327 for keeping a logical value of the power supply voltage VDD from the first PMOS transistor P1 or of the ground voltage GND from the first to third NMOS transistors N1 to N3, and outputting the same as the internal reset signal RESET_IN.

The reset signal output unit 328 is provided with a second NOR gate NOR2 for NOR-operating and outputting the internal reset signal RESET_IN and the external reset signal RESET_EXT, and a tenth inverter INV10 for inverting an output signal of the second NOR gate NOR2 and outputting an inverted signal as the reset signal RESET.

The flow of the signals are explained below in detail with reference to FIGS. 2 to 4. The DLL controller 320 is configured such that it activates the internal reset signal RESET_IN, unless both of the first and second detection signals COARSE_DCC and COARSE_REVERSE become a high level after the locking information signal DCC_ENB is activated to a low level as mentioned above by using the first and second detection signals COARSE_DCC and COARSE_REVERSE generated through the location relationship of the internal clock signal REFCLK and the feedback clock signals FBCLK of FIG. 3. This configuration is added to the scheme of the existing DLL controller, so that the resetting operation of the DLL circuit is carried out when the external reset signal RESET_EXT is applied and the internal reset signal RESET_IN is issued. If the locking information is activated in all of the rising and falling delay chains by the CLOCK GENERATOR of the DLL circuit, the clock PULSE8_11 notifying the end of the phase update period is toggled once every 8 clk. Meanwhile, if the locking information signal DCC_ENB is activated to logic low, it is toggled once every 11 clk. The DLL CONTROLLER performs the sampling process only when the clock PULSE8_11 notifying the end of the phase update period is applied; and thus, it is not seriously affected by a clock jitter. For reference, the jitter spec of the external clock by joint electronic device engineering council (JEDEL) is 250 ps. If a one-unit delay is set to 150 ps, a two-unit delay becomes 300 ps. Therefore, the possibility of malfunction of the DCC CONTROLLER due to the external clock jitter can be reduced. Moreover, if the reset command is issued, the locking information signal DCC_ENB is transited to a logic high, thereby initiating the internal DLL CONTROLLER 326.

Figure 7:
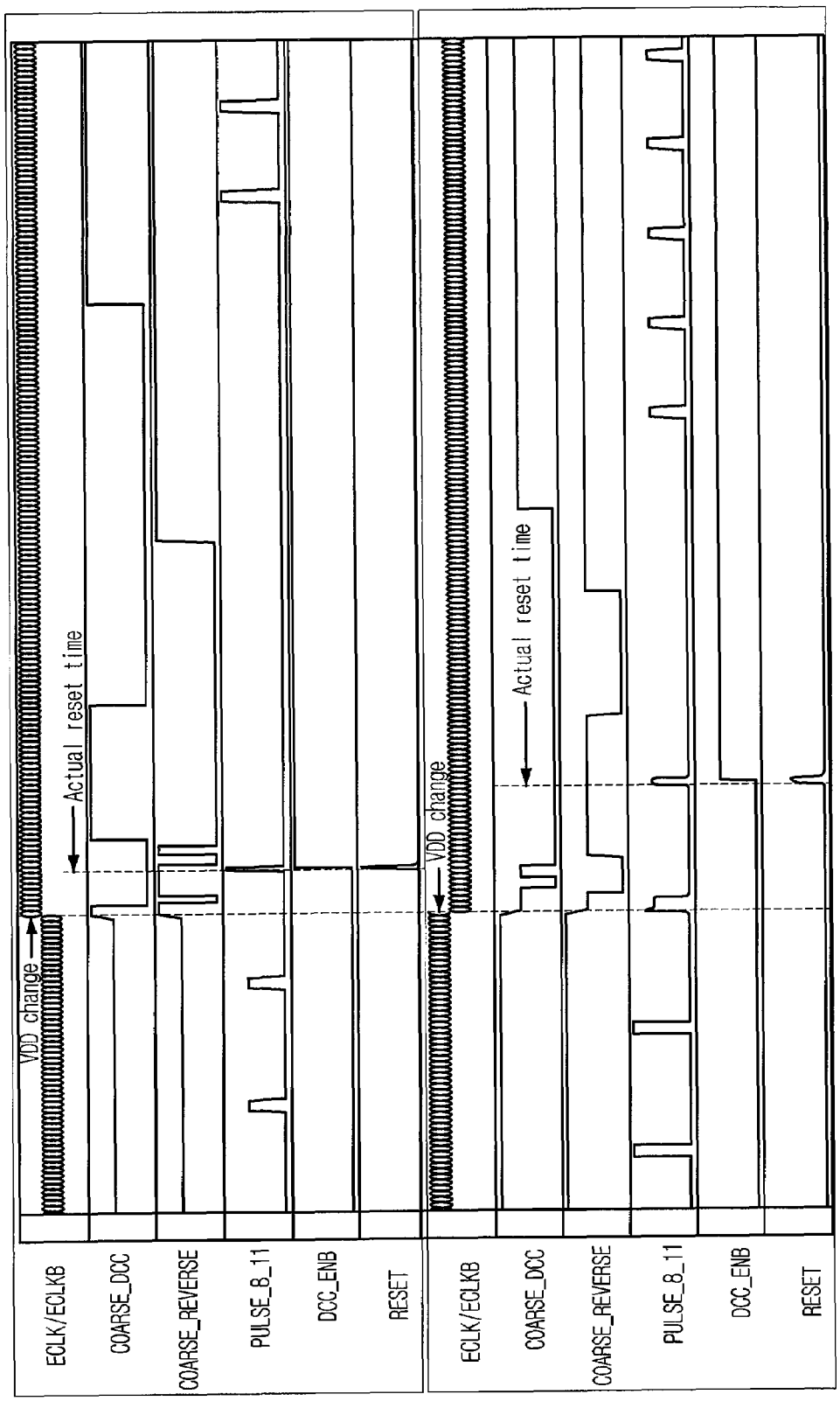
FIG. 7 is a waveform diagram demonstrating an operation of the DLL circuit shown in FIG. 2.

FIG. 7 shows a simulation where the DLL circuit of the present invention as shown in FIG. 2 is applied.

Referring to FIG. 7, if the external power supply voltage VDD is varied from 1.6 V to 2.6 V, it is judged whether a delay difference between the internal clock signal REFCLK and the feedback clock signals FBCLK is within a two-unit delay. If the variation of the delay replication modeling unit is made above the two-unit delay, it can be seen that the reset command is issued. Also, it can be seen that the reset command is issued if the variation of the delay replication modeling unit becomes above the two-unit delay when the external power supply voltage VDD is varied from 2.6 V to 1.6 V, like the instance of varying from 1.6 V to 2.6 V.

By applying the technology of the present invention as described above, in case the locking state is broken due to external changes such as a change of a tCK or power supply voltage VDD, the phase update is conducted using a rough delay value by monitoring the locking state through the phase comparison of the internal clock signal and the feedback clock signal and then making the reset signal RESET internally created. Through this process, the locking state can be again recovered within a certain time, e.g., 200 tCK.

It should be noted that the logic gates and transistors illustrated in the embodiment may be implemented differently in type and location based on polarities of signals applied thereto.

The present application contains subject matter related to Korean patent application No. 2005-90966 and 2005-130880 filed with the Korean Patent Office on Sep. 29, 2005 and Dec. 27, 2005, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A synchronous memory device that is operated in synchronism with an external clock, comprising:
   a delay locked loop (DLL) configured to perform a phase update under the locking state and to detect phase difference between an internal clock signal and a feedback clock signal to generate a detection signal; and
   a control unit configured to control the operation of the DLL in response to the detection signal,
   wherein the DLL includes a phase comparator that receives the internal clock signal and the feedback clock signal and detects the phase difference therebetween to generate the detection signal and a control signal, and performs a phase update based on the control signal output from the phase comparator.

2. The synchronous memory device as recited in claim 1, wherein the control unit resets the DLL in response the detection signal output from the phase comparator.

3. The synchronous memory device as recited in claim 2, wherein the control unit resets the DLL when the locking state is broken by an external change.

4. The synchronous memory device as recited in claim 1, wherein the DLL further includes
   a clock buffer for buffering an external clock signal and outputting an internal clock signal;
   a phase delay and control unit for receiving the internal clock signals and delaying a phase of the internal clock signal to provide a delayed internal clock signal;
   a delay replication modeling unit for modeling output signals of the phase delay and control unit in delay factors of a clock signal within a memory and providing modeled signals as feedback signals; and
   a mode generator for generating a phase update mode signal to control a phase delay of the phase delay and control unit in response to the control signals.

5. The synchronous memory device as recited in claim 4, wherein the DLL further includes
   a clock generator for generating a first clock notifying a start of a phase update period and a second clock notifying an end of the phase update period;
   a duty cycle correction (DCC) unit enabled by a locking information signal when a phase update is completed and the locking information signal is activated and for correcting and outputting duties of the output clock signals of the phase delay and control unit; and
   an output buffer for receiving data from a memory core and outputting the data to a data output pad in synchronism with an output signal of the DCC unit.

6. The synchronous memory device as recited in claim 4, wherein the phase comparator includes a detector that detects and outputs a phase difference between the internal clock signal and each of the feedback clock signals to monitor the phase difference occurring due to an external factor including a change of a clock input from an external device or power supply voltage when the DLL is in a locking state.

7. The synchronous memory device as recited in claim 6, wherein the detector includes:
   a first detector for outputting a first detection signal to judge whether a rising edge of the feedback clock signal is within a two-unit delay on the basis of a rising edge of the internal clock signal; and
   a second detector for outputting a second detection signal to judge whether the rising edge of the internal clock signal is within the two-unit delay on the basis of a rising edge of the feedback clock signal.

8. The synchronous memory device as recited in claim 4, wherein the mode generator includes:
- a fast end signal output unit for outputting a rising fast end signal or a falling fast end signal activated to shift a phase of the phase delay and control unit by a two-unit delay at a time, rather than by a four-unit delay, in response to the first and the second control signals, or the fourth and the fifth control signals; and
- a locking signal output unit for outputting a rising fast and signal or falling fast and signal activated to shift the phase of the phase delay and control unit after further diving the one-unit delay for fine correction, rather than by the two-unit delay at a time, in response to the third control signal or the sixth control signal.

9. A synchronous memory device that is operated in synchronism with an external clock, comprising:
- a delay locked loop (DLL) configured perform a phase update and to detect phase difference between an internal clock signal and a feedback clock signal to generate a detection signal and a control signal;
- a control unit configured to control the operation of the DLL in response to the detection signal; and
- a mode generator configured to generate a phase update mode signal to control a phase delay of the delay locked loop in response to the control signal.

10. The synchronous memory device as recited in claim 9, wherein the DLL includes a phase comparator that receives the internal clock signal and the feedback clock signal and detects the phase difference therebetween to generate the detection signal and a control signal, and performs a phase update based on the control signal output from the phase comparator.

11. The synchronous memory device as recited in claim 10, wherein the control unit resets the DLL in response the detection signal output from the phase comparator.

12. The synchronous memory device as recited in claim 11, wherein the control unit resets the DLL when the locking state is broken by an external change.

13. The synchronous memory device as recited in claim 9, wherein the DLL further includes
- a clock buffer for buffering an external clock signal and outputting an internal clock signal;
- a phase delay and control unit for receiving the internal clock signals and delaying a phase of the internal clock signal to provide a delayed internal clock signal; and
- a delay replication modeling unit for modeling output signals of the phase delay and control unit in delay factors of a clock signal within a memory and providing modeled signals as feedback signals.

14. The synchronous memory device as recited in claim 13, wherein the DLL further includes
- a clock generator for generating a first clock notifying a start of a phase update period and a second clock notifying an end of the phase update period;
- a duty cycle correction (DCC) unit enabled by a locking information signal when a phase update is completed and the locking information signal is activated and for correcting and outputting duties of the output clock signals of the phase delay and control unit; and
- an output buffer for receiving data from a memory core and outputting the data to a data output pad in synchronism with an output signal of the DCC unit.

15. The synchronous memory device as recited in claim 13, wherein the phase comparator includes a detector that detects and outputs a phase difference between the internal clock signal and each of the feedback clock signals to monitor the phase difference occurring due to an external factor including a change of a clock input from an external device or power supply voltage when the DLL is in a locking state.

16. The synchronous memory device as recited in claim 15, wherein the detector includes:
- a first detector for outputting a first detection signal to judge whether a rising edge of the feedback clock signal is within a two-unit delay on the basis of a rising edge of the internal clock signal; and
- a second detector for outputting a second detection signal to judge whether the rising edge of the internal clock signal is within the two-unit delay on the basis of a rising edge of the feedback clock signal.

17. The synchronous memory device as recited in claim 13, wherein the mode generator includes:
- a fast end signal output unit for outputting a rising fast end signal or a falling fast end signal activated to shift a phase of the phase delay and control unit by a two-unit delay at a time, rather than by a four-unit delay, in response to the first and the second control signals, or the fourth and the fifth control signals; and
- a locking signal output unit for outputting a rising fast and signal or falling fast and signal activated to shift the phase of the phase delay and control unit after further diving the one-unit delay for fine correction, rather than by the two-unit delay at a time, in response to the third control signal or the sixth control signal.

* * * * *